(12) United States Patent
Guo et al.

(10) Patent No.: US 9,653,492 B2
(45) Date of Patent: May 16, 2017

(54) ARRAY SUBSTRATE, MANUFACTURING METHOD OF ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xiao Guo, Beijing (CN); Fengzhen Lv, Beijing (CN); Songnan Chu, Beijing (CN); Xinxia Zhang, Beijing (CN); Wei Jiang, Beijing (CN); Kang Xiang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 8 days.

(21) Appl. No.: 14/366,459

(22) PCT Filed: Jun. 26, 2013

(86) PCT No.: PCT/CN2013/077953
§ 371 (c)(1),
(2) Date: Jun. 18, 2014

(87) PCT Pub. No.: WO2014/169525
PCT Pub. Date: Oct. 23, 2014

(65) Prior Publication Data
US 2015/0221681 A1    Aug. 6, 2015

(30) Foreign Application Priority Data

Apr. 16, 2013 (CN) .......................... 2013 1 0132183

(51) Int. Cl.
*G02F 1/136* (2006.01)
*G02F 1/335* (2006.01)
(Continued)

(52) U.S. Cl.
CPC .... *H01L 27/1248* (2013.01); *G02F 1/136209* (2013.01); *G02F 1/136286* (2013.01);
(Continued)

(58) Field of Classification Search
CPC ............. H01L 27/1248; H01L 21/0271; H01L 27/124; H01L 27/1288; H01L 29/41733;
(Continued)

(56) References Cited

U.S. PATENT DOCUMENTS 6,597,413 B2 *  7/2003  Kurashina ......... G02F 1/136213
                                                   349/111
2002/0085156 A1    7/2002  Lee
(Continued)

FOREIGN PATENT DOCUMENTS

CN    1488977 A    4/2004
CN    1577014 A    2/2005
(Continued)

OTHER PUBLICATIONS

International Search Report Appln. No. PCT/CN2013/077953; Dated Jan. 14, 2014.
(Continued)

*Primary Examiner* — Marc Armand
*Assistant Examiner* — Nelson Garces
(74) *Attorney, Agent, or Firm* — Ladas & Parry LLP

(57) ABSTRACT

Embodiments of the disclosure provide an array substrate, a manufacturing method of the array substrate and a display device. The array substrate includes a thin film transistor region and a display region. The thin film transistor region
(Continued)

includes a thin film transistor and a black matrix, and the display region includes a common electrode.

7 Claims, 4 Drawing Sheets

(51) Int. Cl.
H01L 27/12 (2006.01)
G02F 1/1362 (2006.01)
H01L 21/027 (2006.01)
H01L 29/417 (2006.01)
H01L 29/786 (2006.01)

(52) U.S. Cl.
CPC ........ *H01L 21/0271* (2013.01); *H01L 27/124* (2013.01); *H01L 27/1288* (2013.01); *H01L 29/41733* (2013.01); *H01L 29/78633* (2013.01); *G02F 2201/40* (2013.01)

(58) Field of Classification Search
CPC ......... G02F 1/136209; G02F 1/136286; G02F 2201/40
USPC .................................................. 257/342–352
See application file for complete search history.

(56) References Cited

U.S. PATENT DOCUMENTS

| 2004/0070717 | A1 | 4/2004 | Hong et al. |
| 2004/0125261 | A1* | 7/2004 | Lee ................... G02F 1/136209 |
| | | | 349/43 |
| 2004/0266040 | A1 | 12/2004 | Kim et al. |
| 2007/0166894 | A1 | 7/2007 | Lim |
| 2011/0273412 | A1 | 11/2011 | Lee et al. |
| 2012/0181557 | A1 | 7/2012 | Kim et al. |

FOREIGN PATENT DOCUMENTS

| CN | 1992236 A | 7/2007 |
| CN | 101819362 A | 9/2010 |
| CN | 102012590 A | 4/2011 |
| CN | 102156368 A | 8/2011 |
| CN | 102236229 A | 11/2011 |
| CN | 203277383 U | 11/2013 |

OTHER PUBLICATIONS

First Chinese Office Action dated Feb. 10, 2015; Appln. No. 201310132183.8.

International Preliminary report on Patentability Appln. No. PCT/CN2013/077953; Dated Oct. 20, 2015.

* cited by examiner

ARRAY SUBSTRATE, MANUFACTURING METHOD OF ARRAY SUBSTRATE AND DISPLAY DEVICE

TECHNICAL FIELD

Embodiments of the disclosure relate to an array substrate, a manufacturing method of the array substrate and a display device.

BACKGROUND

Thin film transistor liquid crystal display (TFT-LCD) is an important flat-panel display device. According to a direction of an electric field for driving liquid crystal molecules, the TFT-LCD is classified into two types: vertical electric field type and horizontal electric field type. For the TFT-LCD of the vertical electric field type, a pixel electrode is formed on an array substrate and a common electrode is formed on an opposite substrate. Typically, the TFT-LCD of TN mode is of the vertical electric field type. For the TFT-LCD of the horizontal electric field type, the pixel electrode and the common electrode both are formed on the array substrate. Typically, the TFT-LCD of Advanced Super Dimension Switch (ADSDS, ADS for short) mode is of the horizontal electric field type. In the ADS mode, a multi-dimensional electric field is formed with both an electric field generated at edges of slit electrodes in a same plane and an electric field generated between a slit electrode layer and a plate-like electrode layer, so that liquid crystal molecules at all orientations, which are provided directly above the electrodes or between the slit electrodes in a liquid crystal cell, can be rotated, In this way, the work efficiency of liquid crystal can be enhanced and the light transmittance can be increased. The ADS mode can improve the image quality of the thin film transistor liquid crystal display and has advantages of high resolution, high transmittance, low power consumption, wide viewing angle, high aperture ratio, low chromatic aberration, high response speed, free of push Mura, etc. Furthermore, the improvements of ADS mode comprise I-ADS technology with a high-transmittance, H-ADS technology with a high aperture ratio, S-ADS technology with a high-resolution and the like.

FIG. 1 is a structural schematic view illustrating the array substrate of the TFT-LCD of ADS mode according to one technique. As shown in FIG. 1, the array substrate mainly comprises a thin film transistor (comprising a gate electrode 1, a gate insulating layer 3, a semiconductor layer 6, a doped semiconductor layer 5, a source electrode 4-1 and a drain electrode 4-2), a first transparent electrode layer 2 (i.e., the common electrode), a first passivation insulating layer 7 and the pixel electrode 8. The thin film transistor is a bottom-gate type thin film transistor, the pixel electrode 8 is connected to the drain electrode 4-2 through a via hole A formed in the first passivation insulating layer 7. During manufacturing the above-mentioned array substrate, five mask processes are generally employed, and in this case, the manufacture process is complicated and the manufacture cost is increased.

In addition, in the TFT-LCD, a black matrix is generally provided on the opposite substrate to prevent light leakage. The opposite substrate and the array substrate are aligned and bonded with each other to form the liquid crystal panel. However, during the process of aligning the array substrate and the opposite substrate, misalignment inevitably occurs and light leakage is resulted. In order to prevent the light leakage caused by the misalignment, the width of the black matrix has to be increased and thus the aperture ratio is reduced.

SUMMARY

According to some embodiments of the disclosure, an array substrate is provided. The array substrate comprises a thin film transistor region and a display region. The thin film transistor region comprises a thin film transistor and a black matrix, and the display region comprises a common electrode.

According to some embodiments of the disclosure, a manufacturing method of an array substrate is provided. The array substrate comprises a thin film transistor region and a display region, the thin film transistor region comprises a thin film transistor and a black matrix, and the display region comprises a common electrode. The method comprises a step of: forming a common electrode, a black matrix, and a semiconductor active layer, an ohmic contact layer, a drain electrode and a source electrode of the thin film transistor by a same patterning process.

According to some embodiments of the disclosure, a display device is provided. The display device comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
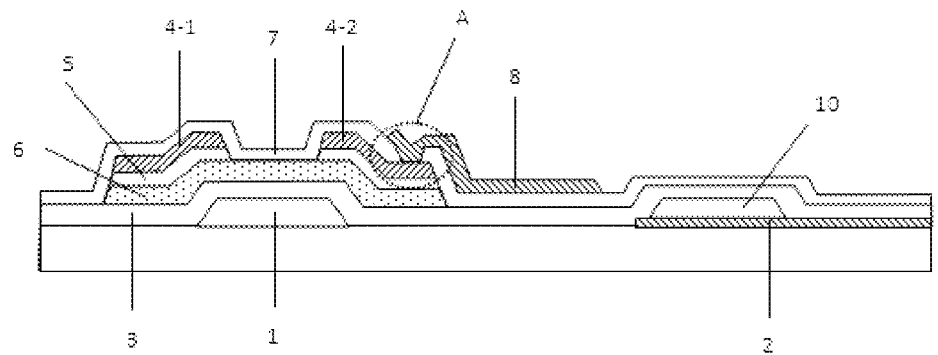
FIG. 1 is a schematic view illustrating an array substrate of a TFT-LCD of ADS mode according to one technique.
Figure 2:
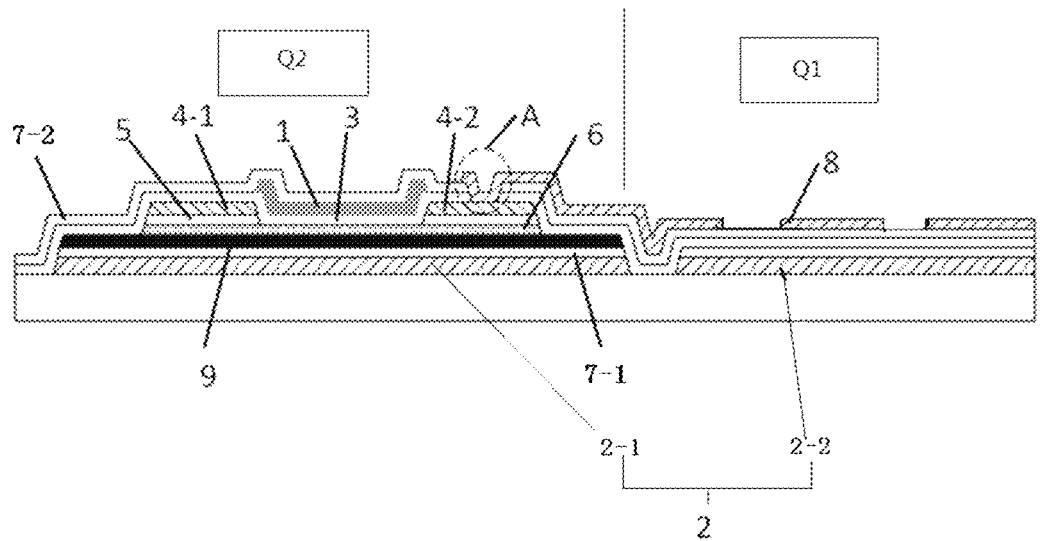
FIG. 2 is a schematic view illustrating an array substrate according to some embodiments of the disclosure.

According to some embodiments of the disclosure, an array substrate is provided. As shown in FIG. 2, the array substrate is applicable to a TFT-LCD of ADS mode and employs a thin film transistor of top gate type. The array substrate comprises a thin film transistor region Q2 and a display region Q1.

The thin film transistor region Q2 comprises a black matrix 9, a thin film transistor (comprising a gate electrode 1, a gate insulating layer 3, a source electrode 4-1, a drain electrode 4-2, a semiconductor active layer 6 and an ohmic contact layer 5), and a first transparent conductive layer 2-1. The first transparent conductive layer 2-1 is provided on a base substrate for forming the array substrate and is provided below the black matrix 9. The black matrix 9 is provided on the first transparent conductive layer 2-1. The semiconductor active layer 6 is provided on the black matrix 9. The ohmic contact layer 5 is provided between the source electrode 4-1 and the drain electrode 4-2 of the thin film transistor and the semiconductor active layer 6 of the thin film transistor.

The display region Q1 comprises a first transparent electrode 2-2 provided on the base substrate. The first transparent electrode 2-2 and the first transparent conductive layer 2-1 are provided in a same layer and are disconnected with each other. For example, the first transparent electrode 2-2 is served as a common electrode.

In the TFT-LCD according to one technique, the black matrix is provided on an opposite substrate, and misalignment inevitably occurs during aligning and bonding the opposite substrate and the array substrate, thereby resulting in a light leakage. To prevent the light leakage caused by the misalignment, the width of the black matrix has to be increased; however the wider black matrix leads to the decline of the aperture ratio.

In the embodiments of the disclosure, the black matrix 9 is provided on the array substrate. Therefore, the light leakage caused by the misalignment will not occur, and furthermore, the problem that the aperture ratio is decreased caused by increasing the width of the black matrix 9 is prevented. Furthermore, in the embodiments of the disclosure, the black matrix 9 is able to be made narrower to further improve the aperture ratio. In addition, in the embodiments of the disclosure, the array substrate comprises the thin film transistor region Q2 and the display region Q1, as described below, the black matrix 9 provided in the thin film transistor region Q2 together with the first transparent conductive layer 2-1, the common electrode 2-2, the semiconductor active layer 6, the ohmic contact layer 5, the source electrode 4-1 and the drain electrode 4-2 are formed by a same patterning process, and therefore the manufacture process of the array substrate is simplified and the manufacture cost is reduced.

For example, the array substrate according to the embodiments further comprises a first passivation insulating layer 7-1. The first passivation insulating layer 7-1 is provided on the first transparent conductive layer 2-1 in the thin film transistor region and is provided on the first transparent electrode 2-2 (i.e. the common electrode) in the display region. Furthermore, as described below, the first passivation insulating layer 7-1 together with the first transparent conductive layer 2-1, the common electrode 2-2, the black matrix 9, the semiconductor active layer 6, the ohmic contact layer 5, the source electrode 4-1 and the drain electrode 4-2 are formed by the same patterning process without additional patterning process. It should be noted that, the first passivation insulating layer 7-1 may not be provided if the black matrix 9 is formed of an insulating material.

As shown in FIG. 2, the thin film transistor in the array substrate according to the embodiments of the disclosure is of top gate type. As the array substrate is provided with the black matrix 9 and the semiconductor active layer 6 is provided on the black matrix 9, the black matrix 9 prevents light of a backlight from entering into the semiconductor active layer 6 and the semiconductor active layer 6 is not influenced by the light of the backlight. It should be noted that, the thin film transistor of bottom gate type is also applicable to the array substrate according to the embodiments of the disclosure.

As shown in FIG. 2, the array substrate according to the embodiments of the disclosure further comprises a gate insulating layer 3 and a second passivation insulating layer 7-2. The gate insulating layer 3 is provided below the gate electrode 1 of the thin film transistor. The second passivation insulating layer 7-2 is provided on the gate electrode 1 of the thin film transistor. A via hole A is provided in the gate insulating layer 3 and the second passivation insulating layer 7-2 above the drain electrode 4-2 of the thin film transistor. A pixel electrode 8 is provided on the second passivation insulating layer 7-2, and is connected with the drain electrode 4-2 of the thin film transistor through the via hole A. The pixel electrode 8 is provided above the common electrode 2-2, and the array substrate is of ADS mode. Furthermore, the pixel electrode 8 is a slit electrode, and the common electrode (i.e., the first transparent electrode 2-2) is a plate electrode.

In the array substrate according to the embodiments of the disclosure, the black matrix 9 is formed on the array substrate. Therefore, the light leakage caused by the misalignment will not occur, and furthermore, the problem that the aperture ratio is decreased caused by increasing the width of the black matrix 9 is prevented. Furthermore, in the embodiments of the disclosure, the black matrix 9 is able to be made narrower to further improve the aperture ratio. In addition, as described below, the black matrix provided in the thin film transistor region Q2 together with the first transparent conductive layer 2-1, the common electrode 2-2, the semiconductor active layer 6, the ohmic contact layer 5, the source electrode 4-1 and the drain electrode 4-2 are formed by the same patterning process, and therefore the manufacture process of the array substrate is simplified and the manufacture cost is reduced.

According to some embodiments of the disclosure, a manufacturing method of an array substrate is provided. The array substrate comprises a thin film transistor region and a display region, the thin film transistor region comprises a thin film transistor and a black matrix, and the display region comprises a common electrode. For example, the method comprises the following steps.

S01. Forming a first transparent electrode (i.e., the common electrode) 2-2, a first passivation insulating layer 7-1, the black matrix 9, a semiconductor active layer 6, an ohmic contact layer 5, a source electrode 4-1 and a drain electrode 4-2 on a base substrate by a first patterning process.

Figure 3A:
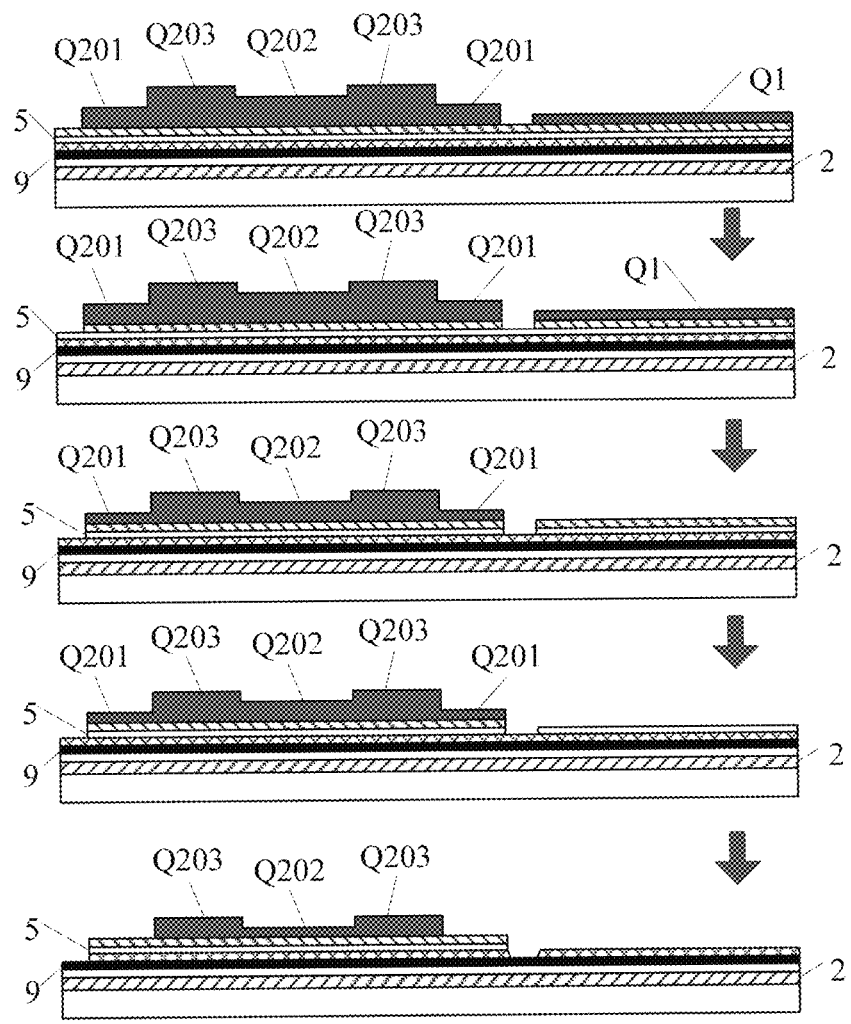
FIGS. 3A and 3B are schematic views illustrating a first patterning process of a manufacturing method of an array substrate according to some embodiments of the disclosure.
Figure 3B:
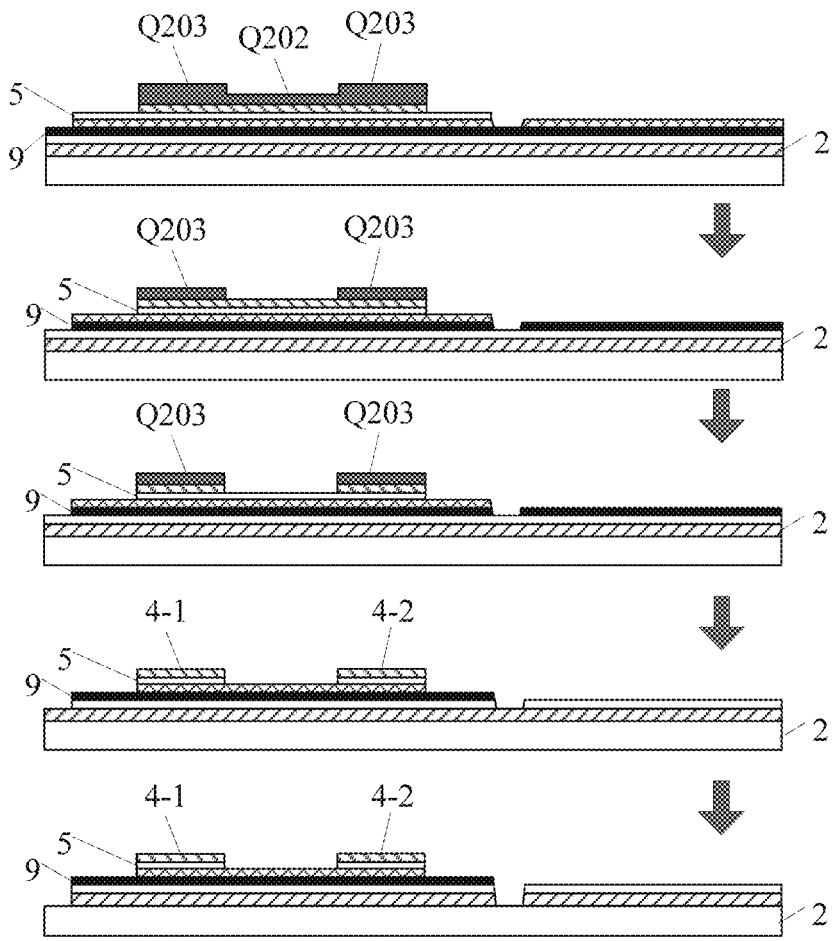
Figure 4:
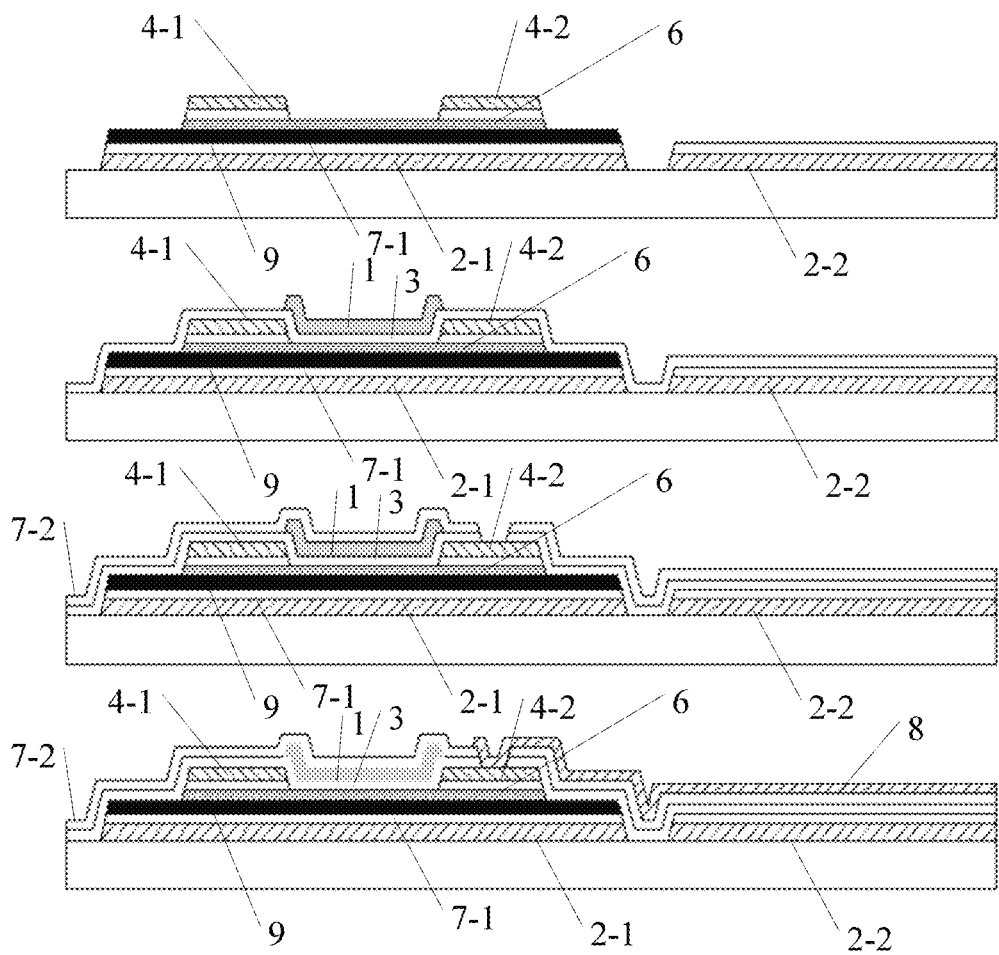
FIG. 4 is a schematic view illustrating four patterning processes of the manufacturing method of the array substrate according to some embodiments of the disclosure.

As shown in FIGS. 3A and 3B, for example, the step S01 is performed as follows.

A first transparent conductive material layer, a first passivation insulating material layer, a black matrix layer, a semiconductor layer, a doped semiconductor layer, a source-drain metal layer are sequentially formed on the base substrate, and a photoresist layer is applied on the source-drain metal layer.

The photoresist layer is exposed and developed to form photoresist regions with different thicknesses. The photoresist in the display region Q1 have a first thickness, the photoresist in a connection region Q201 has a second thickness, the photoresist in an active region Q202 has a third thickness, and the photoresist in a source-drain region Q203 has a fourth thickness. The second thickness is larger than the first thickness, the third thickness is larger than the second thickness and the fourth thickness is larger than the third thickness. The connection region Q201, the active region Q202 and the source-drain region Q203 are comprised in the transistor region Q2, the connection region Q201 is a region in the transistor region Q2 other than the active region Q202 and the source-drain region Q203. A disconnection region is provided between the display region Q1 and the connection region Q201, and the disconnection region is comprised in a photoresist-completely-removed region.

The source-drain metal layer in the photoresist-completely-removed region is removed by an etching process.

An ashing or etching process is performed to remove the photoresist and exposed doped semiconductor layer by a thickness equal to that of the photoresist in the display region;

Exposed source-drain metal layer is removed by an etching process.

An ashing or etching process is performed to remove the photoresist, exposed doped semiconductor layer and exposed semiconductor layer by a thickness equal to that of the residual photoresist in the connection region;

Exposed source-drain metal layer is removed by an etching process.

An etching process is performed to remove the photoresist, exposed doped semiconductor layer, exposed semiconductor layer, and exposed black matrix layer by a thickness equal to that of the residual photoresist in the active region.

Exposed source-drain metal layer in the active layer is removed by an etching process.

An ashing or etching process is performed to remove residual photoresist, exposed doped semiconductor layer, exposed semiconductor layer, exposed black matrix layer and exposed first passivation insulating material layer.

Exposed first transparent conductive material layer is removed by an etching process.

It should be noted that, in the above step S01, the photoresist layer is exposed by adopting a dual-tone mask (such as a halftone mask or a gray tone mask) or a multi-tone mask so as to form photoresist regions with different thicknesses by adopting the same mask.

In the step S01, the first transparent electrode (i.e., the common electrode) 2-2, the first passivation insulating layer 7-1, the black matrix 9, the semiconductor active layer 6, the ohmic contact layer 5, the source electrode 4-1 and the drain electrode 4-2 are formed by the same patterning process (i.e., the first patterning process). For example, in this step, a first transparent conductive layer 2-1, a source signal line, a drain signal line and their corresponding leads are simultaneously formed. The first transparent conductive layer 2-1 is provided in the transistor region Q2 and is provided below the black matrix 9. The first transparent conductive layer 2-1 and the common electrode 2-2 are provided in the same layer and are disconnected from each other.

S02. Sequentially depositing a gate insulating material layer and a gate metal layer on the base substrate after the step S01, and forming a gate insulating layer 3 and a gate electrode 1 of the thin film transistor by a second patterning process.

S03. Depositing a second passivation insulating material layer on the base substrate after the step S02, forming a second passivation insulating layer 7-2 by a third patterning process, and simultaneously forming a via hole A in the gate insulating layer 3 and the second passivation layer 7-2 above the drain electrode of the thin film transistor; and S04. Depositing a pixel electrode layer on the base substrate after the step S03, and forming a pixel electrode 8 by a fourth patterning process, wherein the pixel electrode 8 is connected with the drain electrode 4-2 of the thin film transistor through the via hole A.

Accordingly, the manufacture of the array substrate is completed.

In the embodiments of the disclosure, the array substrate of the TFT-LCD of ADS mode is manufactured by four patterning process, thereby the manufacture process is simplified and the manufacture cost is reduced.

In the TFT-LCD according to one technique, the black matrix is provided on the opposite substrate, and an additional patterning process has to be performed to form the black matrix on the opposite substrate.

In the embodiments of the disclosure, the black matrix 9 is formed on the array substrate, and the black matrix 9, the first transparent electrode (i.e., the common electrode) 2-2, the first passivation insulating layer 7-1, the semiconductor active layer 6, the ohmic contact layer 5, the source electrode 4-1 and the drain electrode 4-2 are formed by the same patterning process. Thus, as for the whole manufacture process of the TFT-LCD, two patterning processes are omitted. Thereby, the manufacture process is simplified and the manufacture cost is reduced.

In the embodiments of the disclosure, the black matrix is formed on the array substrate. Therefore, the light leakage caused by the misalignment will not occur, and furthermore, the problem that the aperture ratio is decreased caused by increasing the width of the black matrix is prevented. Furthermore, in the embodiments of the disclosure, the black matrix is able to be made narrower to further improve the aperture ratio.

According to some embodiments of the invention, a display device is provided. The display device comprises the array substrate as described above. The display device is an OLED panel, a mobile phone, a tablet computer, a television, a liquid crystal display device, a notebook computer, a digital photo frame, a navigator or any other products or components with a display function.

The display device according to the embodiments employs the array substrate as described above, and thereby the manufacture process is simplified, the manufacture cost is reduced and the aperture ration is increased.

It should be noted that, the display device according to the embodiments further comprises other components, such as a power source and a display driving unit, which are known by those skilled in the art and are not described here for simplicity.

The foregoing embodiments merely are exemplary embodiments of the disclosure, and not intended to define the scope of the disclosure, and the scope of the disclosure is determined by the appended claims.

What is claimed is:

1. A manufacturing method of an array substrate, wherein the array substrate comprises a thin film transistor region and a display region, the thin film transistor region comprises a thin film transistor and a black matrix, and the display region comprises a common electrode; and
the method comprises a step of: forming a common electrode, a black matrix, and a semiconductor active layer, an ohmic contact layer, a drain electrode and a source electrode of the thin film transistor by a same patterning process with a same mask.

2. The manufacturing method of the array substrate according to claim 1, wherein a first transparent conductive layer and a first passivation insulating layer are further formed during forming the common electrode, the black matrix, and the semiconductor active layer, the ohmic contact layer, the drain electrode and the source electrode of the thin film transistor by the same patterning process;

the first transparent conductive layer is provided in the thin film transistor region, and the first transparent conductive layer in the thin film transistor region and the common electrode in the display region are provided in a same layer and are disconnected with each other; and the first passivation insulating layer is provided on the first transparent conductive layer in the thin film transistor region and is provided on the common electrode in the display region, and the first passivation insulating layer is provided below the black matrix in the thin film transistor region.

3. The manufacturing method of the array substrate according to claim 2, wherein the step of forming the common electrode, the black matrix, and the semiconductor active layer, the ohmic contact layer, the drain electrode and the source electrode of the thin film transistor by the same patterning process comprises:

sequentially forming a first transparent conductive material layer, a first passivation insulating material layer, a black matrix layer, a semiconductor layer, a doped semiconductor layer, a source-drain metal layer on a base substrate, and applying a photoresist layer on the source-drain metal layer;

exposing and developing the photoresist layer to form photoresist regions with different thicknesses, wherein the photoresist in the display region have a first thickness, the photoresist in a connection region has a second thickness, the photoresist in an active region has a third thickness, and the photoresist in a source-drain region has a fourth thickness, the second thickness is larger than the first thickness, the third thickness is larger than the second thickness and the fourth thickness is larger than the third thickness, the connection region, the active region and the source-drain region are comprised in the thin film transistor region, the connection region is a region in the thin film transistor region other than the active region and the source-drain region, and the photoresist in the display region is disconnected with the photoresist in the connection region;

removing the source-drain metal layer in a region which is not covered by the photoresist;

removing the photoresist and exposed doped semiconductor layer by a thickness equal to that of the photoresist in the display region;

removing exposed source-drain metal layer;

removing the photoresist, exposed doped semiconductor layer and exposed semiconductor layer by a thickness equal to that of residual photoresist in the connection region;

removing exposed source-drain metal layer;

removing the photoresist, exposed doped semiconductor layer, exposed semiconductor layer, and exposed black matrix layer by a thickness equal to that of residual photoresist in the active region;

removing exposed source-drain metal layer in the active layer;

removing residual photoresist, exposed doped semiconductor layer, exposed semiconductor layer, exposed black matrix layer and exposed first passivation insulating material layer; and removing exposed first transparent conductive material layer.

4. The manufacturing method of the array substrate according to claim 1, further comprising steps of:

forming a gate insulating layer and a gate electrode of the thin film transistor by a same patterning process;

forming a second passivation insulating layer by a same patterning process, and simultaneously forming a via hole in the gate insulating layer and the second passivation insulating layer above a drain electrode of the thin film transistor; and forming a pixel electrode by a same patterning process, wherein the pixel electrode is connected with the drain electrode of the thin film transistor through the via hole.

5. The manufacturing method of the array substrate according to claim 3, wherein the photoresist layer is exposed by a halftone mask or a gray-tone mask.

6. The manufacturing method of the array substrate according to claim 2, further comprising steps of:

forming a gate insulating layer and a gate electrode of the thin film transistor by a same patterning process;

forming a second passivation insulating layer by a same patterning process, and simultaneously forming a via hole in the gate insulating layer and the second passivation insulating layer above a drain electrode of the thin film transistor; and forming a pixel electrode by a same patterning process, wherein the pixel electrode is connected with the drain electrode of the thin film transistor through the via hole.

7. The manufacturing method of the array substrate according to claim 3, further comprising steps of:

forming a gate insulating layer and a gate electrode of the thin film transistor by a same patterning process;

forming a second passivation insulating layer by a same patterning process, and simultaneously forming a via hole in the gate insulating layer and the second passivation insulating layer above a drain electrode of the thin film transistor; and forming a pixel electrode by a same patterning process, wherein the pixel electrode is connected with the drain electrode of the thin film transistor through the via hole.

* * * * *